United States Patent
Yano et al.

(10) Patent No.: US 9,945,699 B2
(45) Date of Patent: Apr. 17, 2018

(54) SENSOR NODE PACKAGE

(71) Applicant: NGK Insulators, LTD., Nagoya (JP)

(72) Inventors: Shinsuke Yano, Nagoya (JP); Keiichiro Watanabe, Kasugai (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 15/459,476

(22) Filed: Mar. 15, 2017

(65) Prior Publication Data

US 2017/0184427 A1   Jun. 29, 2017

Related U.S. Application Data

(63) Continuation of application No. PCT/JP2014/075837, filed on Sep. 29, 2014.

(51) Int. Cl.
| | |
|---|---|
| *H01R 13/46* | (2006.01) |
| *G01D 11/24* | (2006.01) |
| *H05K 5/00* | (2006.01) |
| *H05K 5/03* | (2006.01) |
| *B65D 79/00* | (2006.01) |
| *B65D 65/38* | (2006.01) |

(52) U.S. Cl.
CPC ........... *G01D 11/245* (2013.01); *B65D 65/38* (2013.01); *B65D 79/00* (2013.01); *H05K 5/0004* (2013.01); *H05K 5/03* (2013.01)

(58) Field of Classification Search
CPC ...... G01D 11/245; H05K 5/0004; H05K 5/03; B65D 79/00; B65D 65/38
USPC ........................................................ 174/520
See application file for complete search history.

(56) References Cited

U.S. PATENT DOCUMENTS

| | | | |
|---|---|---|---|
| 2011/0232387 A1* | 9/2011 | Sakurai | G01L 9/0022 |
| | | | 73/702 |
| 2014/0049927 A1* | 2/2014 | Kamakura | H05K 1/183 |
| | | | 361/760 |
| 2014/0292433 A1* | 10/2014 | Yamada | H03H 9/0547 |
| | | | 331/156 |

FOREIGN PATENT DOCUMENTS

| | | |
|---|---|---|
| JP | 08-181235 A1 | 7/1996 |
| JP | 09-107043 A1 | 4/1997 |
| JP | 2001-291789 A1 | 10/2001 |
| JP | 2003-104772 A1 | 4/2003 |
| JP | 2007-059736 A1 | 3/2007 |
| JP | 2007-073711 A1 | 3/2007 |
| JP | 2007-234640 A1 | 9/2007 |

(Continued)

OTHER PUBLICATIONS

International Search Report and Written Opinion (Application No. PCT/JP2014/075837) dated Nov. 11, 2014.

(Continued)

*Primary Examiner* — Sherman Ng

(74) *Attorney, Agent, or Firm* — Burr & Brown, PLLC

(57) ABSTRACT

Provided is a sensor node package where the breakage of a package member and/or a lid member due to thermal stress is reduced.

The Young's modulus (220 GPa or less) of the package member, the thermal expansion coefficient (2 to 12 ppm/° C.) of the package member, the difference (5 ppm/° C. or less) in thermal expansion coefficient between the package member and the lid member, and the thickness (3 mm or less) of the lid member are adapted respectively to fall within predetermined ranges, thereby making it possible for the breakage of the package member and/or lid member due to thermal stress to be reduced effectively.

15 Claims, 2 Drawing Sheets

(56) References Cited

FOREIGN PATENT DOCUMENTS

JP 2008-271093 A1 11/2008
JP 2013-122718 A1 6/2013

OTHER PUBLICATIONS

International Preliminary Report on Patentability (Application No. PCT/JP2014/075837) dated Apr. 13, 2017 (with English translation).

* cited by examiner

FIG. 1
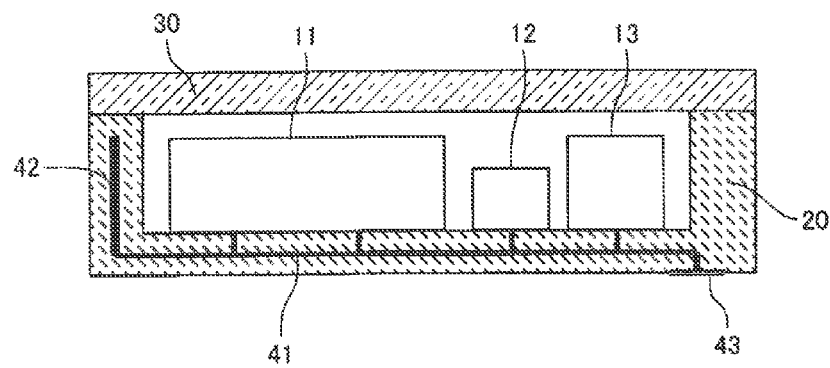
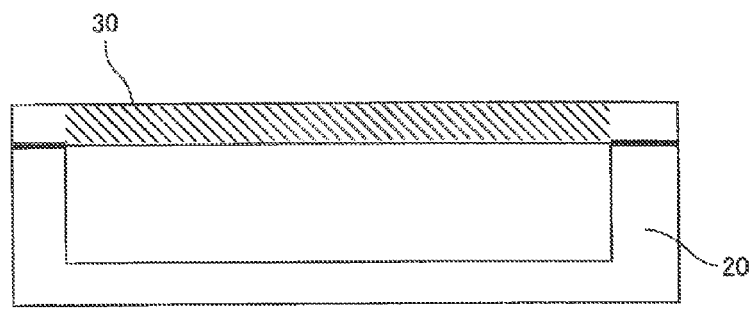
FIG. 2A
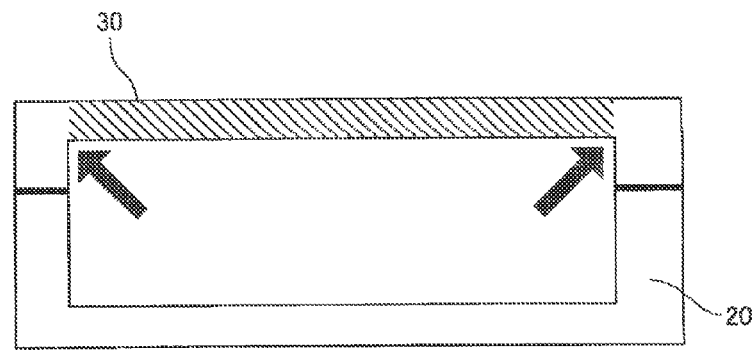
FIG. 2B

SENSOR NODE PACKAGE

TECHNICAL FIELD

The present invention relates to a sensor node package. More particularly, the present invention relates to a sensor node package where the breakage of a package member and/or a lid member due to thermal stress associated with changes in temperature is reduced effectively.

BACKGROUND ART

Systems are known where sensors are attached to structures, for example, such as bridges and buildings, to sense physical quantities such as vibrations in the structures, thereby monitoring the conditions of the structures, and thus monitoring generated deterioration and/or breakage of the structures. In such systems, it is not desirable to lay cables or the like for the power supply to the sensors and the acquisition of signals sensed by the sensors, because the space and laying operation therefor are required.

Therefore, systems referred to as "sensor networks" have been developed where multiple sensors that have wireless communication functions (also referred to as "wireless terminals with sensors" and "sensor nodes") are adapted to work in a coordinated manner, thereby monitoring the conditions of structures. The individual sensor nodes are each composed of a sensor, a wireless chip, a microprocessor, and a power source (for example, a battery).

The sensor nodes are required to have high environment resistance, because it takes long to monitor the conditions of structures with the systems as mentioned above. Therefore, for the purpose of improving the environment resistance and/or insulation properties of sensor nodes, for example, as shown in FIG. 1, it has been proposed that constituent components (11 to 13) for a sensor node as described above are housed within a package member (20) formed of a ceramic material, and a lid member (30) formed of a ceramic material is bonded integrally to the package member (20) (for example, see Patent Document 1).

In the package member (20), conductor patterns may be buried, for example, such as a wiring (41) for electrically connecting the constituent components (11 to 13) for a sensor node, housed within the member, to each other, an antenna (42) for wireless communications, and an external electrode (43). The sensor node also desirably has a resistive loss reduced, and high-frequency characteristics improved. Therefore, the conductor patterns mentioned above are desirably formed of good conductors (for example, silver (Ag) and copper (Cu)). Because of the low melting points of the good conductors, it is common to use a low-temperature co-fired ceramic (LTCC: Low Temperature Co-fired Ceramics) as a material that forms the package member.

On the other hand, it is common to use, as a material that forms the lid member, alumina ($Al_2O_3$) which is relatively inexpensive and widely used, rather than the LTCC which is expensive as compared with common ceramic materials. In addition, alumina also has the advantages of favorable wettability to glass for use as a material (bonding material) for bonding the package member and the lid member, and also of high mechanical strength.

PRIOR ART DOCUMENTS

Patent Documents

Patent Document 1: Japanese Patent Application Laid-Open No. 2013-122718

SUMMARY OF INVENTION

Problems to be Solved by the Invention

As described previously, sensor nodes are known which have excellent environment resistance and insulation properties, with constituent components for sensor nodes housed within housings composed of package members and lid members formed of ceramic materials. The package members and the lid members are bonded by providing a bonding material (for example, a paste including a glass powder (glass paste) and a glass material such as glass ribbon) on the surfaces to be bonded between the members, and melting the bonding material through the heating to a temperature equal to or higher than the melting point of the bonding material. In this case, the sensor nodes are exposed to tremendous changes in temperature. Moreover, as described previously, the sensor nodes are placed in external environments, and thus exposed to rapid changes in temperature and/or thermal shocks.

On the other hand, as described previously, in general, the package members are formed of the LTCC, whereas the lid members are formed of alumina. While the LTCC and the alumina are both ceramic materials, the respective compositions are different from each other, and the properties also differ in some respects. More specifically, the thermal expansion coefficient of the material that forms the package members may be different from the thermal expansion coefficient of the material that forms the lid members. In such a case, when the sensor nodes are exposed to tremendous changes in temperature, e.g., in the case of bonding the package members and the lid members as mentioned above, as well as rapid changes in temperature and/or thermal shocks in external environments where the sensor nodes are placed, there is a possibility that problems will be caused such as the package members and/or lid members broken by stress (thermal stress) due to the difference in thermal expansion coefficient, from large differences in dimension change, associated with changes in temperature between the package members and the lid members.

In order to avoid such problems as mentioned above, it is desirable to cause the thermal expansion coefficient of the material that forms the package members to be coincident with the thermal expansion coefficient of the material that forms the lid members as much as possible. However, as mentioned above, in general, the material that forms the package members differs from the material that forms the lid members, it is thus difficult to cause the thermal expansion coefficients to be always coincident with each other, and depending on the combination of the two, the difference in thermal expansion coefficient may be increased.

As just described, in the art, there has been demand for sensor node packages where the breakage of package members and/or lid members due to thermal stress is reduced.

Means for Solving the Problems

Accordingly, one object of the present invention is to provide a sensor node package where the breakage of a package member and/or a lid member due to thermal stress is reduced. The inventor has, as a result of earnest studies carried out in order to achieve the object mentioned above, found that the Young's modulus of the package member, the thermal expansion coefficient of the package member, the difference in thermal expansion coefficient between the package member and the lid member, and the thickness of the lid member are adapted respectively to fall within predetermined ranges, thereby making it possible for the breakage of the package member and/or lid member due to thermal stress to be reduced effectively.

More specifically, a sensor node package according to the present invention (hereinafter, which may be referred to as an "inventive package") is a sensor node package having a housing including:

a package member formed of a first ceramic material, and having a recess part formed; and a lid member formed of a second ceramic material, and integrally bonded to the package member to seal the recess part, wherein the first ceramic material has a Young's modulus of 220 GPa or less, a first thermal expansion coefficient that is a thermal expansion coefficient of the first ceramic material is 2 ppm/° C. or more and 12 ppm/° C. or less, an absolute value of a difference between the first thermal expansion coefficient and a second thermal expansion coefficient that is a thermal expansion coefficient of the second ceramic material is 5 ppm/° C. or less, a bonded region is defined as a region corresponding to a bonded-surface of said lid member with said package member in a projection drawing of said lid member onto a plane parallel to a main surface of said lid member, a non-bonded region is defined as a region excluding said bonded region in said projection drawing, and a part of said lid member corresponding to said non-bonded region has an average thickness of 3mm or less in a normal direction to a main surface of said lid member.

Effects of the Invention

As mentioned above, in the inventive package, the Young's modulus of the package member, the thermal expansion coefficient of the package member, the difference in thermal expansion coefficient between the package member and the lid member, and the thickness of the lid member are adapted respectively to fall within the predetermined ranges. Thus, the breakage of the package member and/or lid member due to thermal stress associated with changes in temperature, for example, in the case of bonding the package member and the lid member can be reduced effectively.

BRIEF DESCRIPTION OF DRAWINGS

FIG. 1 is a schematic sectional side view illustrating an example of the configuration of a sensor node housed in a package that has a housing including a package member and a lid member.

FIGS. 2A and 2B is a schematic sectional side view illustrating the structures of different types of lid members for sensor node packages, and for each type of lid member, the locations of non-bonded parts and corners on which thermal stress is likely to be concentrated.

DESCRIPTION OF EMBODIMENTS

First Embodiment

Figure 3A:
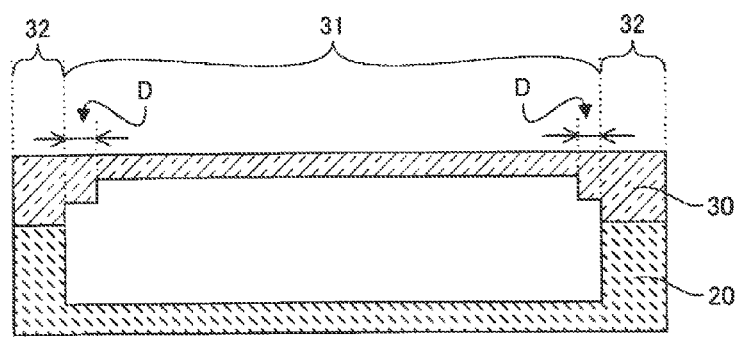
FIGS. 3A and 3B is a schematic sectional side view illustrating a specific example of a different type of structure for a sensor node package (second package) according to a second embodiment of the present invention.

A sensor node package according to a first embodiment of the present invention (hereinafter, which may be referred to as a "first package") will be described below.

(Configuration)

The first package has a similar structure to common sensor node packages. Specifically, the first package has a housing including a package member and a lid member. As described previously, ceramic materials are preferred as materials constituting housings of sensor node packages, because the materials have high environment resistance and insulation properties. The package member is formed of a first ceramic material. The lid member is formed of a second ceramic material. These ceramic materials may be any ceramic materials as long as the materials satisfy the property conditions described below. Furthermore, the first ceramic material and the second ceramic material may be the same ceramic material, or different ceramic materials.

The package member has a recess part formed. Various types of constituent components (for example, a sensor, a wireless chip, a microprocessor, and a power source (for example, battery)) for the sensor node can be housed in the recess part. The lid member is integrally bonded to the package member, thereby sealing the recess part formed in the package member. It is to be noted that the package member and the lid member are bonded by as described previously, providing a bonding material (for example, a paste including a glass powder (glass paste) and a glass material such as glass ribbon) on the surface to be bonded between the members, and melting the bonding material through the heating to a temperature equal to or higher than the melting point of the bonding material.

It is to be noted that the package member and the lid member may be manufactured by any approach as long as it is possible to meet the configuration mentioned above. For example, the specific method for manufacturing the package member and the lid member as mentioned above can be selected appropriately from among various methods widely used in the art, for example, as methods for manufacturing ceramic products such as a wiring substrate that adopts a base material composed of a dielectric material including a ceramic material mainly. Common specific examples of such manufacturing methods can include, for example, so-called "doctor blade methods" and "gel cast methods".

(Property Conditions)

In the first package, various types of properties for the constituent members satisfy the following conditions:

(1) The first ceramic material has a Young's modulus of 220 GPa or less;

(2) The first thermal expansion coefficient that is the thermal expansion coefficient of the first ceramic material, is 2 ppm/° C. or more and 12 ppm/° C. or less;

(3) An absolute value of the difference between the first thermal expansion coefficient and the second thermal expansion coefficient that is the thermal expansion coefficient of the second ceramic material, is 5 ppm/° C. or less; and (4) A bonded region is defined as a region corresponding to a bonded-surface of said lid member with said package member in a projection drawing of said lid member onto a plane parallel to a main surface of said lid member, a non-bonded region is defined as a region excluding said bonded region in said projection drawing, a part of said lid member corresponding to said non-bonded region has an average thickness of 3mm or less in a normal direction to a main surface of said lid member.

The Young's modulus of the ceramic material as specified in the condition (1) can be measured by methods well known to one skilled in the art. For example, the method for measuring the Young's modulus of the ceramic material is specified in the JIS R 1602. The thermal expansion coefficients of the ceramic materials, as specified in the conditions (2) and (3), can be measured by methods well known to one skilled in the art. For example, the method for measuring the thermal expansion coefficients of the ceramic materials is specified in the JIS R 1618.

The non-bonded part of the lid member as specified in the condition (4) can be considered as a part of the lid member, which is not directly involved in bonding to the package member, for example, as shown by shaded parts in FIGS. 2A and 2B. More specifically, the non-bonded part of the lid member is, as shown by the shaded parts in FIGS. 2A and 2B, as for the lid member, a part (the shaded parts in FIGS. 2A and 2B) of the lid member, corresponding to a "non-bonded region" that is a region excluding a "bonded region" that is a region corresponding to a surface (heavy lines in FIGS. 2A and 2B) bonded to the package member, in a projection drawing of the lid member onto a plane parallel to a main surface of the lid member.

The "thickness" specified in the condition (4) refers to a dimension along the normal to the main surface of the lid member, as mentioned above. The thickness of the non-bonded part of the lid member can be also measured by methods well known to one skilled in the art. For example, the thickness may be measured at multiple points of the non-bonded part of the lid member with the use of a thickness measurement instrument such as a thickness gauge, for example, and the average of the measurement values may be obtained. Alternatively, the average value for the non-bonded part thickness of the lid member can be obtained by dividing the volume of a part corresponding to the non-bonded region of the lid member by the area of the non-bonded region.

(Effects)

As described previously, for the sensor node package that has the housing including the package member and lid member formed of the ceramic materials, the package member and the lid member are bonded at an extremely high temperature. Specifically, a bonding material (for example, a glass material) provided at the surface to be bonded between the package member and the lid member is melted through the heating to a temperature equal to or higher than the melting point of the material, thereby bonding the package member and the lid member. In this case, the sensor node is exposed to tremendous changes in temperature. Thus, in the case of sensor node packages according to the prior art, there is a possibility that package members and/or lid members will be broken due to stress (thermal stress) caused by the differences in thermal expansion coefficient between the package members and the lid members. Moreover, after the bonding, the sensor nodes are placed in external environments, and thus exposed to rapid changes in temperature and/or thermal shocks in the external environments. Thus, also in this case, there is a possibility of breakages due to stress caused by the differences in thermal expansion coefficient between the package members and the lid members. As just described, the sensor node package is required to have reliability in the heat cycle of repeated exposure to high temperatures and low temperatures, which corresponds to the rapid changes in temperature and/or the thermal shocks.

On the other hand, the sensor node package (first package) according to the first embodiment of the present invention satisfies all of the conditions (1) to (4) mentioned above, thereby effectively reducing the breakage of the package member and/or lid member, which is caused by thermal stress as mentioned above.

First, as the condition (1), the first ceramic material that forms the package member has a Young's modulus of 220 GPa or less. This Young's modulus reduced to 220 GPa or less can lower the rigidity of the package member, thereby causing the package member to relax such thermal stress as mentioned above. As a result, the breakage of the package member and/or lid member can be reduced effectively, which is caused by such thermal stress as mentioned above. More preferably, the first ceramic material has a Young's modulus of 180 GPa or less.

Next, as the condition (2), the first thermal expansion coefficient that is the thermal expansion coefficient of the first ceramic material is 2 ppm/° C. or more and 12 ppm/° C. or less. The first thermal expansion coefficient adapted to fall within this range avoids the excessively increased difference in thermal expansion coefficient from the ceramic material which can be adopted as the second ceramic material that forms the lid member, thereby making it easy to satisfy the condition (3). As a result, the breakage of the package member and/or lid member can be reduced effectively, which is caused by such thermal stress as mentioned above. More specifically, the first thermal expansion coefficient is 4 ppm/° C. or more and 11 ppm/° C. or less.

Furthermore, as the third condition (3), an absolute value of the difference between the first thermal expansion coefficient and the second thermal expansion coefficient that is the thermal expansion coefficient of the second ceramic material that forms the lid member is 5 ppm/° C. or less. The absolute value of the difference between the first thermal expansion coefficient and the second thermal expansion coefficient is reduced to 5 ppm/° C. or less, thereby making it possible to effectively reduce the breakage of the package member and/or lid member, which is caused by such thermal stress as mentioned above. More preferably, the absolute value of the difference between the thermal expansion coefficients is 3 ppm/° C. or less.

In addition, as the condition (4), the average value of the thickness of the non-bonded part of the lid member (non-bonded part thickness) is 3 mm or less. The average value for the non-bonded thickness, reduced to 3 mm or less can lower the rigidity of the lid member, thereby causing the lid member to relax such thermal stress as mentioned above. As a result, the breakage of the package member and/or lid member can be reduced effectively, which is caused by such thermal stress as mentioned above. More preferably, the average value of the non-bonded part thickness is 2 mm or less on average value.

Second Embodiment

In this regard, the shape of the lid member included in the housing of the package according to the present invention is not particularly limited, but typically, examples of the shape can include, for example, a plate-like shape as a whole as shown in FIG. 2A. Alternatively, the examples can include a shape, as shown in FIG. 2B, with a rim part (corresponding to the part other than a shaded part of a lid member shown in FIG. 2B) provided on the periphery of a plate-shaped part of the lid member (corresponding to the shaded part of the lid member shown in FIG. 2B). In the former case, the bonded surface between the lid member and the package member corresponds to a region near the periphery of a main surface of the lid member on the package member side. In the latter case, the bonded surface between the lid member and the package member corresponds to the top surface of the rim part.

In the sensor node package including any type of the former and latter lid members, stress (thermal stress) generated with changes in temperature due to the difference in thermal expansion coefficient between the package member and the lid member is generated at the bonded surface between the lid member and the package member. However, in the latter type of lid member, the top surface of the rim part provided on the periphery of the plate-shaped part corresponds to the bonded surface as mentioned above. For this reason, in the latter type of lid member, thermal stress is likely to be concentrated on corners formed by the plate-shaped part and the rim part (for example, parts indicated by arrows in FIG. 2B), and the breakage (for example, cracks and the like) of the lid member is likely to be caused at the corners. More specifically, the lid member including the rim part is more likely to cause breakage due to thermal stress, as compared with a lid member including no rim part.

Therefore, a sensor node package according to a second embodiment of the present invention (hereinafter, which may be referred to as a "second package") is configured as follows.

(Configuration)

The second package is configured as with the first package, except for the following aspect.

In the second package, the lid member has a plate-shaped part, and a rim part provided from an outer peripheral part of the plate-shaped part and provided with the bonded surface as a top surface. More specifically, the lid member in the second package has a shape of the type described above with reference to FIG. 2B.

However, in the second package, corners formed by the plate-shaped part and the rim part have shapes preferred for relaxing and/or dispersing thermal stress generated due to the difference in thermal expansion coefficient between the package member and the lid member. Specifically, the plate-shaped part is formed such that the thickness of the part is increased from a position at a predetermined distance from the rim part, toward the rim part.

Figure 3B:
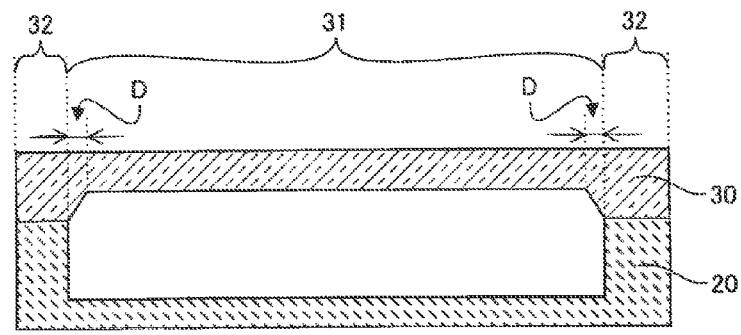

A specific example of the second package configured as mentioned above is shown in FIGS. 3A and 3B. In the example shown in FIG. 3A, a plate-shaped part 31 of a lid member 30 is formed such that the thickness of the part is increased in a stepwise fashion from a position at a predetermined distance D from a rim part 32, toward the rim part 32. It is to be noted that while the thickness of the plate-shaped part 31 is increased only in one step in this example, the thickness of the plate-shaped part 31 may be increased in multiple separate steps. On the other hand, in the example shown in FIG. 3B, a plate-shaped part 31 of a lid member 30 is formed such that the thickness of the part is increased continuously from a position at a predetermined distance D from a rim part 32, toward the rim part 32. It is to be noted that while the thickness of the plate-shaped part 31 is increased in a linear fashion in this example, the thickness of the plate-shaped part 31 may be increased in a curved fashion.

(Effects)

In the second package, the lid member has, as mentioned above, the plate-shaped part, and the rim part provided from the outer peripheral part of the plate-shaped part and provided with the bonded surface as a top surface. However, in the second package, the plate-shaped part is formed such that the thickness of the part is increased from a position at a predetermined distance from the rim part, toward the rim part. Thus, thermal stress which is likely to be concentrated on the corners formed by the plate-shaped part and the rim part is effectively relaxed and/or dispersed. As a result, the breakage (for example, cracks) of the lid member at the corners is reduced.

Third Embodiment

As described previously, ceramic materials are preferred as materials constituting housings of sensor node packages, because the materials have high environment resistance and insulation properties. The first ceramic material that forms the package member of the inventive package may be any ceramic material, as long as the material satisfies the property conditions described above. In particular, oxide-based ceramics are, for example, from the viewpoints of availability and cost, preferred as the ceramic material that forms the package member of the inventive package.

(Configuration)

Therefore, in a sensor node package according to a third embodiment of the present invention (hereinafter, which may be referred to as a "third package"), the first ceramic material is an oxide-based ceramic.

(Effects)

As described above, the oxide-based ceramics are, in general, easily available and low in cost (low in price). Accordingly, the adoption of an oxide-based ceramic as the first ceramic material as mentioned above expands the range of choices for materials that satisfy the property conditions as described above. Furthermore, the cost for manufacturing the inventive package can be kept from being increased.

Fourth Embodiment

In this regard, as described previously, in the package member, conductor patterns may be buried, for example, such as wirings for electrically connecting constituent components of the sensor node housed within the package member to each other, and antennas for wireless communications. The sensor node also desirably has a resistive loss reduced, and high-frequency characteristics improved. Therefore, the conductor patterns mentioned above are desirably formed of good conductors (for example, silver (Ag) and copper (Cu)). However, because of the low melting points of the good conductors, in the case of firing the package member formed of the first ceramic material, there is a possibility that the good conductors will be melted, thereby deforming and/or breaking conductor patterns.

(Configuration)

Therefore, it is desirable to adopt, as the first ceramic material that forms the package member, a ceramic that can be fired at a lower temperature than the melting points of the good conductors. Accordingly, in a sensor node package according to a fourth embodiment of the present invention (hereinafter, which may be referred to as a "fourth package"), the first ceramic material is a low-temperature co-fired ceramic (LTCC). It is to be noted that examples of the LTCC include, for example, a ceramic obtained by firing, as a raw material, a mixture of a glass powder and a ceramic powder (filler powder). Crystallized glass which is crystallized after firing can be also used as the glass powder. Furthermore, as fillers in such an LTCC, not only alumina but also various oxide powders and/or nitride powders can be used to control, for example, properties (for example, thermal expansion coefficient, mechanical strength, and thermal conductivity) of the LTCC material. Other examples of the LTCC can include a ceramic obtained by firing a mixture of a powder synthesized at a high temperature with an oxide of an alkali-earth metal, an aluminum oxide, and a silicon oxide as main raw materials, and a relatively small amount of glass powder and/or a powder composed of a constituent that forms glass.

(Effects)

The adoption of the LTCC as the first ceramic material as mentioned above can lower the firing temperature for the package member in the fourth package. As a result, the possibility of melting good conductors, thereby deforming and/or breaking the conductor patterns can be reduced in the case of firing the package member.

Fifth Embodiment

As described previously, ceramic materials are preferred as materials constituting housings of sensor node packages, because the materials have high environment resistance and insulation properties. The second ceramic material that forms the lid member of the inventive package may be also any ceramic material, as long as the material satisfies the property conditions described above. For example, oxide-based ceramics are, for example, from the viewpoints of availability and cost, preferred as the ceramic material that forms the lid member of the inventive package. On the other hand, many of non-oxide-based ceramics have higher strength than the oxide-based ceramics, and the non-oxide-based ceramics are preferred for further reinforcing the package member and/or lid member of the first package.

(Configuration)

Therefore, in a sensor node package according to a fifth embodiment of the present invention (hereinafter, which may be referred to as a "fifth package"), the second ceramic material is an oxide-based ceramic.

(Effects)

As described above, the oxide-based ceramics are, in general, easily available and low in cost (low in price). Accordingly, the adoption of an oxide-based ceramic as the second ceramic material as mentioned above expands the range of choices for materials that satisfy the property conditions as described above. Furthermore, the cost for manufacturing the inventive package can be kept from being increased.

Sixth Embodiment

In this regard, as described previously, the low-temperature co-fired ceramic (LTCC) is expensive as compared with common ceramic materials. On the other hand, in general, sensor node packages rarely have conductor patterns buried within lid members, and there is a reduced need to adopt LTCC as materials for the lid members, as compared with package members.

(Configuration)

Therefore, it is desirable to adopt, as the second ceramic material that forms the lid member, alumina ($Al_2O_3$) which is relatively inexpensive and used widely. Therefore, in a sensor node package according to a sixth embodiment of the present invention (hereinafter, which may be referred to as a "sixth package"), the second ceramic material is alumina.

(Effects)

The adoption of alumina as the second ceramic material as mentioned above makes it possible for the sixth package to keep the manufacturing cost from being increased, while ensuring the environment resistance and insulation properties required as the lid member. In addition, alumina has favorable wettability to glass for use as a material (bonding material) for bonding the package member and the lid member, and also high mechanical strength, and alumina is thus preferred as a material that forms the lid member.

A sensor node package according to a particular embodiment of the present invention will be described in more detail below. However, the following description is absolutely intended for purposes of illustration, and the scope of the present invention should not be construed as being limited to the following description.

EXAMPLES

1) Preparation of Evaluation Package

Various types of first ceramic materials and various types of second ceramic materials listed in Table 1 below were used to produce respective package members and lid members. It is to be noted that details of the LTCC1 to LTCC4 listed in Table 1 as the first materials will be described below.

The LTCC 1 refers to an LTCC material made from, as raw materials, a ceramic powder composed of an alumina (aluminum oxide) powder, and a crystallized glass powder containing, as its main constituents, an alkali-earth metal oxide, a silicon oxide, and an aluminum oxide, and containing, as its accessory constituents, a boron oxide and the like. The glass included in the LTCC 1 is partially or entirely crystallized after sintering.

The LTCC 2 refers to an LTCC material made from, as raw materials, a ceramic powder containing a barium oxide as its main constituent, synthesized at a high temperature from an alkali-earth oxide, an aluminum oxide, and a silicon oxide, and a relatively small amount of glass material.

The LTCC 3 refers to an LTCC material made from, as raw materials, a ceramic powder composed of an alumina (aluminum oxide) powder, and a borosilicate-based glass powder which is largely uncrystallized.

The LTCC 4 refers to an LTCC material made from, as a raw material, only a crystallized glass powder containing, as its main constituents, an alkali-earth metal oxide, a silicon oxide, and an aluminum oxide, and the contents of the respective constituents are determined so as to deposit cordierite as main crystals after sintering.

The various package members and lid members produced with the use of the various types of materials mentioned above were bonded through the heating to 400° C. with the use of a glass powder as a bonding material, thereby preparing various types of evaluation packages according to Examples E01 to E 11 and Comparative Examples C01 to C04. The various types of evaluation packages were made 30 mm×30 mm to 150 mm×150 mm in size, and 50 mm in thickness.

The measurement conditions are as described previously for the Young's modulus for each package member, and the thermal expansion coefficients (CTE1 and CTE2) for each package member and each lid member. The thickness for each lid member was calculated by dividing the volume of a part corresponding to the non-bonded region of the lid member by the area of the non-bonded region. Table 1 also lists the results of measuring the Young's modulus for each package member, the thermal expansion coefficients (CTE1 and CTE2) for each package member and each lid member, the difference in the absolute value (|ΔCTE|CTE1 and CTE2) of the difference in thermal expansion coefficient between each package member and each lid member, and the thickness for each lid member. It is to be noted that the thermal expansion coefficients (CTE1 and CTE2) were measured in the temperature range of 40° C. to 400° C.

TABLE 1

| | Package Member | | | Lid member | | | | |
|---|---|---|---|---|---|---|---|---|
| | First Material | Young's Modulus [GPa] | CTE1 [ppm/° C.] | Second Material | CTE2 [ppm/° C.] | Thickness [mm] | |ΔCTE| [ppm/° C.] | Damage |
| E01 | LTCC1 | 170 | 8.0 | Alumina | 7.0 | 2.0 | 1.0 | No |
| E02 | Mullite | 220 | 5.0 | Alumina | 7.0 | 3.0 | 2.0 | No |
| E03 | Forsterite | 190 | 11.0 | Alumina | 7.0 | 2.0 | 4.0 | No |
| E04 | LTCC2 | 90 | 11.5 | Alumina | 7.0 | 2.0 | 4.5 | No |
| E05 | LTCC3 | 110 | 6.0 | Alumina | 7.0 | 2.0 | 1.0 | No |
| E06 | LTCC4 | 150 | 2.0 | Alumina | 7.0 | 1.0 | 5.0 | No |
| E07 | LTCC3 | 110 | 6.0 | Alumina | 7.0 | 3.0 | 1.0 | No |
| E08 | LTCC3 | 110 | 6.0 | Mullite | 5.0 | 3.0 | 1.0 | No |
| E09 | LTCC1 | 170 | 8.0 | Mullite | 5.0 | 3.0 | 3.0 | No |
| E10 | LTCC1 | 170 | 8.0 | $Si_3N_4$ | 3.0 | 3.0 | 5.0 | No |
| E11 | Mullite | 220 | 5.0 | AlN | 4.5 | 3.0 | 0.5 | No |
| C01 | LTCC4 | 150 | 2.0 | Alumina | 7.0 | 3.5 | 5.0 | Yes |
| C02 | Titania | 270 | 12.2 | Alumina | 7.0 | 1.5 | 5.2 | Yes |
| C03 | AlN | 300 | 4.5 | Alumina | 7.0 | 3.0 | 2.5 | Yes |
| C04 | Cordierite | 140 | 1.5 | Alumina | 7.0 | 2.0 | 5.5 | Yes |

2) Accelerated Deterioration Test

The various types of evaluation packages according to Examples E01 to E11 and Comparative Examples C01 to C04 were subjected to a heat cycle of heating and cooling repeated in the temperature range of +100° C. to −55° C. Specifically, constant-temperature baths maintained at a high temperature (+100° C.) and a low temperature (−55° C.) were prepared respectively, and a cycle of: holding the various types of evaluation packages in one of the constant-temperature baths for 30 minutes; then transferring the packages into the other constant-temperature bath within 30 seconds; and holding the packages therein for 30 minutes was repeated 100 times.

3) Evaluation of Damage

The various types of evaluation packages according to Examples E01 to E11 and Comparative Examples C01 to C04, subjected to the accelerated deterioration test mentioned above, were visually observed near the bonded surfaces between the package members and the lid members, thereby checking whether there was damage such as cracks or not. As a result, the various types of evaluation packages according to Examples E01 to E11 within predetermined ranges in terms of all of: the Young's modulus of the package member; the thermal expansion coefficient of the package member; the difference in thermal expansion coefficient between the package member and the lid member; and the thickness of the lid member have succeeded in effectively reducing the breakage of the package member and lid member due to thermal stress. On the other hand, the various types of evaluation packages according to Comparative Examples C01 to C04 with any of the property values departing from the predetermined ranges, have been all found to have damage to the package member and/or the lid member.

From the foregoing results, it has been confirmed that the breakage of the package member and/or the lid member due to thermal stress associated with changes in temperature, for example, in the case of bonding the package member and the lid member can be effectively reduced, with the sensor node package according to the present invention where the Young's modulus of the package member, the thermal expansion coefficient of the package member, the difference in thermal expansion coefficient between the package member and the lid member, and the thickness of the lid member respectively fall within predetermined ranges.

While the several embodiments and examples that have the specific configurations have been described above, in some cases, with reference to the accompanying drawings for purposes of illustrating the present invention, the scope of the present invention should not be construed as being limited to the illustrative embodiments and examples, but obviously, modifications can be made appropriately within the scope of what is set forth in the claims and the specification.

REFERENCE SIGNS LIST 11 to 13: constituent component; 20: package member; 30: lid member; 31: plate-shaped part; 32: rim part; 41: wiring; 42: antenna; and 43: external electrode.

The invention claimed is:

1. A sensor node package having a housing comprising:
 a package member formed of a first ceramic material, and having a recess part formed; and
 a lid member formed of a second ceramic material, and integrally bonded to said package member to seal said recess part,
 wherein said first ceramic material has a Young's modulus of 220 GPa or less,
 a first thermal expansion coefficient that is a thermal expansion coefficient of said first ceramic material is 2 ppm/° C. or more and 12 ppm/° C. or less,
 an absolute value of a difference between said first thermal expansion coefficient and a second thermal expansion coefficient that is a thermal expansion coefficient of said second ceramic material is 5 ppm/° C. or less,
 a bonded region is defined as a region corresponding to a bonded-surface of said lid member with said package member in a projection drawing of said lid member onto a plane parallel to a main surface of said lid member,
 a non-bonded region is defined as a region excluding said bonded region in said projection drawing, and
 a part of said lid member corresponding to said non-bonded region has an average thickness of 3mm or less in a normal direction to a main surface of said lid member.

2. The sensor node package according to claim 1, wherein the lid member comprises a plate-shaped part, and a rim part provided from an outer peripheral part of the plate-shaped part and provided with the bonded surface as a top surface, and the plate-shaped part is formed such that a thickness of the plate-shaped part is increased from a position at a predetermined distance from the rim part, toward the rim part.

3. The sensor node package according to claim 1, wherein the first ceramic material is an oxide-based ceramic.

4. The sensor node package according to claim 3, wherein the first ceramic material is a low-temperature co-fired ceramic.

5. The sensor node package according to claim 1, wherein the second ceramic material is an oxide-based ceramic.

6. The sensor node package according to claim 5, wherein the second ceramic material is alumina.

7. The sensor node package according to claim 2, wherein the first ceramic material is an oxide-based ceramic.

8. The sensor node package according to claim 2, wherein the second ceramic material is an oxide-based ceramic.

9. The sensor node package according to claim 3, wherein the second ceramic material is an oxide-based ceramic.

10. The sensor node package according to claim 4, wherein the second ceramic material is an oxide-based ceramic.

11. The sensor node package according to claim 7, wherein the second ceramic material is an oxide-based ceramic.

12. The sensor node package according to claim 8, wherein the second ceramic material is alumina.

13. The sensor node package according to claim 9, wherein the second ceramic material is alumina.

14. The sensor node package according to claim 10, wherein the second ceramic material is alumina.

15. The sensor node package according to claim 11, wherein the second ceramic material is alumina.

\* \* \* \* \*